(12) United States Patent
Hofmeister

(10) Patent No.: US 6,485,250 B2
(45) Date of Patent: *Nov. 26, 2002

(54) SUBSTRATE TRANSPORT APPARATUS WITH MULTIPLE ARMS ON A COMMON AXIS OF ROTATION

(75) Inventor: Christopher A. Hofmeister, Hampstead, NH (US)

(73) Assignee: Brooks Automation Inc., Chelmsford, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 7 days.

(21) Appl. No.: 09/223,508

(22) Filed: Dec. 30, 1998

(65) Prior Publication Data

US 2001/0036398 A1 Nov. 1, 2001

(51) Int. Cl.[7] .............................................. B66C 23/00
(52) U.S. Cl. ................ 414/744.1; 414/744.4; 414/744.5; 414/937
(58) Field of Search ............... 414/744.1, 744.4, 414/744.5, 744.6, 937

(56) References Cited

U.S. PATENT DOCUMENTS

| | | | |
|---|---|---|---|
| 3,869,219 A | 3/1975 | Wilson et al. | 403/282 |
| 4,712,971 A * | 12/1987 | Fyler | 414/744.1 |
| 4,715,921 A | 12/1987 | Maher et al. | 156/345 |
| 5,512,320 A | 4/1996 | Turner et al. | 427/255 |
| 5,577,879 A | 11/1996 | Eastman et al. | 414/744.5 |
| 5,584,647 A * | 12/1996 | Uehara | 414/744.5 |
| 5,647,724 A | 7/1997 | Davis et al. | 414/744.5 |
| 5,720,590 A * | 2/1998 | Hofmeister | 414/744.5 |
| 5,741,113 A * | 4/1998 | Bacchi et al. | 414/744.6 |
| 5,765,444 A | 6/1998 | Bacchi et al. | 74/490.03 |
| 5,765,983 A | 6/1998 | Caveney et al. | 414/217 |
| 5,789,878 A | 8/1998 | Krocker et al. | 318/45 |
| 5,813,823 A * | 9/1998 | Hofmeister | 414/744.5 |
| 5,944,476 A * | 8/1999 | Bacchi et al. | 414/744.6 |
| 5,975,834 A * | 11/1999 | Ogawa et al. | 414/744.5 |
| 5,993,142 A * | 11/1999 | Genov et al. | 414/744.5 |
| 6,105,454 A * | 8/2000 | Bacchi et al. | 414/744.5 |

FOREIGN PATENT DOCUMENTS

DE 3719503 * 12/1988 ............... 414/744.5

OTHER PUBLICATIONS

Publication of JEP, "LTHR4394" robot, 1 page.
Publication of RORZE, "RR405" robot, 1 page.

* cited by examiner

*Primary Examiner*—Robert P. Olszewski
*Assistant Examiner*—Steven B. McAllister
(74) *Attorney, Agent, or Firm*—Perman & Green, LLP

(57) ABSTRACT

A substrate transport apparatus having a drive section, two independently movable arm assemblies connected to the drive section on a common axis of rotation, and substrate holders connected to the arm assemblies. The drive section includes three coaxial drive shafts with a pulley connected to one of the shafts. The arm assemblies are connected to respective ones of the two other shafts.

24 Claims, 5 Drawing Sheets

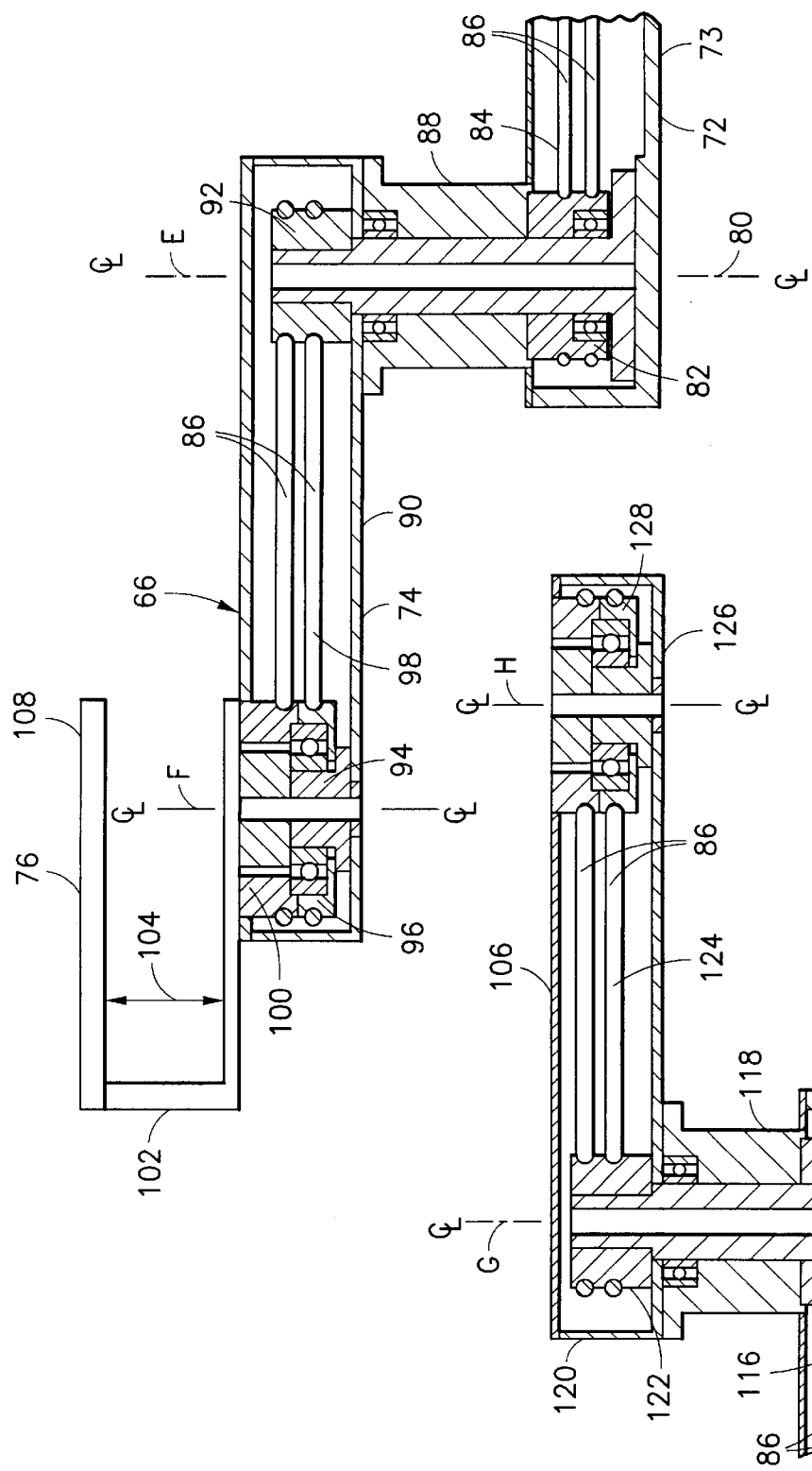

SUBSTRATE TRANSPORT APPARATUS WITH MULTIPLE ARMS ON A COMMON AXIS OF ROTATION

BACKGROUND OF THE INVENTION

1. Field of the Invention

The present invention relates to a substrate transport apparatus and, more particularly, to an apparatus with multiple arm assemblies on a common axis of rotation.

2. Prior Art

U.S. Pat. No. 5,720,590 discloses an articulated arm transfer device having a drive section with coaxial drive shafts, magnetic driving stators stationarily connected to a frame, and magnetic driven rotors on the shafts. U.S. Pat. Nos. 5,577,879 and 5,765,983 disclose scara arms. Non-coaxial side-by-side dual scara arms are offered for sale by three Japanese companies; the UTW and UTV series of robots by MECS, the RR series of robots by RORZE; and the LTHR, STHR, SPR series of robots by JEL.

SUMMARY OF THE INVENTION

In accordance with one embodiment of the present invention a substrate transport apparatus is provided comprising a drive section, two independently movable arm assemblies, and substrate holders. The arm assemblies are connected to the drive section on a common axis of rotation. The substrate holders are connected to the arm assemblies.

In accordance with another embodiment of the present invention, a substrate transport apparatus is provided comprising two independently movable arm assemblies, substrate holders, and a drive section. The substrate holders are connected to the arm assemblies. The drive section has a frame, a pulley rotatably connected to the frame by a first drive, and second and third drives connected to the arm assemblies. The pulley is operably connected to both the two arm assembly by transmission members.

In accordance with another embodiment of the present invention, a substrate transport apparatus drive system is provided comprising a frame, magnetic driving stators, a drive shaft assembly, and a pulley. The stators are stationarily connected to the frame. The drive shaft assembly has at least three coaxial shafts. Each shaft has a magnetic driven section aligned with a separate one of the magnetic drive stators. The pulley is rotatably connected to the frame by one of the shafts.

In accordance with another embodiment of the present invention a substrate transport apparatus is provided comprising N independently movable arm assemblies, substrate holders, and means for independently rotating each of the arm assemblies. Each arm assembly has A axis of rotation about which at least a portion of the arm assembly can rotate. N and A are integers greater than one. The substrate holders are connected to the arm assemblies. The rotating means can rotate the arm assemblies about their respective A axis. The rotating means comprises M motors. M is an integer less than N times the smallest value of A.

In accordance with one method of the present invention a method of moving a substrate transport apparatus is provided comprising steps of providing the apparatus with a frame, a pulley rotatably mounted to the frame, and two arm assemblies rotatably mounted to the frame; rotating the pulley relative to the frame as the two arm assemblies are rotated with the pulley to rotate both arm assemblies in a same direction relative to the frame; and maintaining the pulley in a stationary position on the frame as the two arm assemblies are independently rotated relative to the frame to independently extend and retract the arm assemblies.

BRIEF DESCRIPTION OF THE DRAWINGS

The foregoing aspects and other features of the present invention are explained in the following description, taken in connection with the accompanying drawings, wherein:

FIG. 3B is an enlarged cross-sectional view of the arm on the left side of the drive unit shown in FIG. 3;

FIG. 3C is an enlarged cross-sectional view of the arm on the right side of the drive unit shown in FIG. 3; and FIG. 4 is a perspective view of an alternate embodiment of a movable arm assembly.

DETAILED DESCRIPTION OF THE PREFERRED EMBODIMENT

Figure 1:
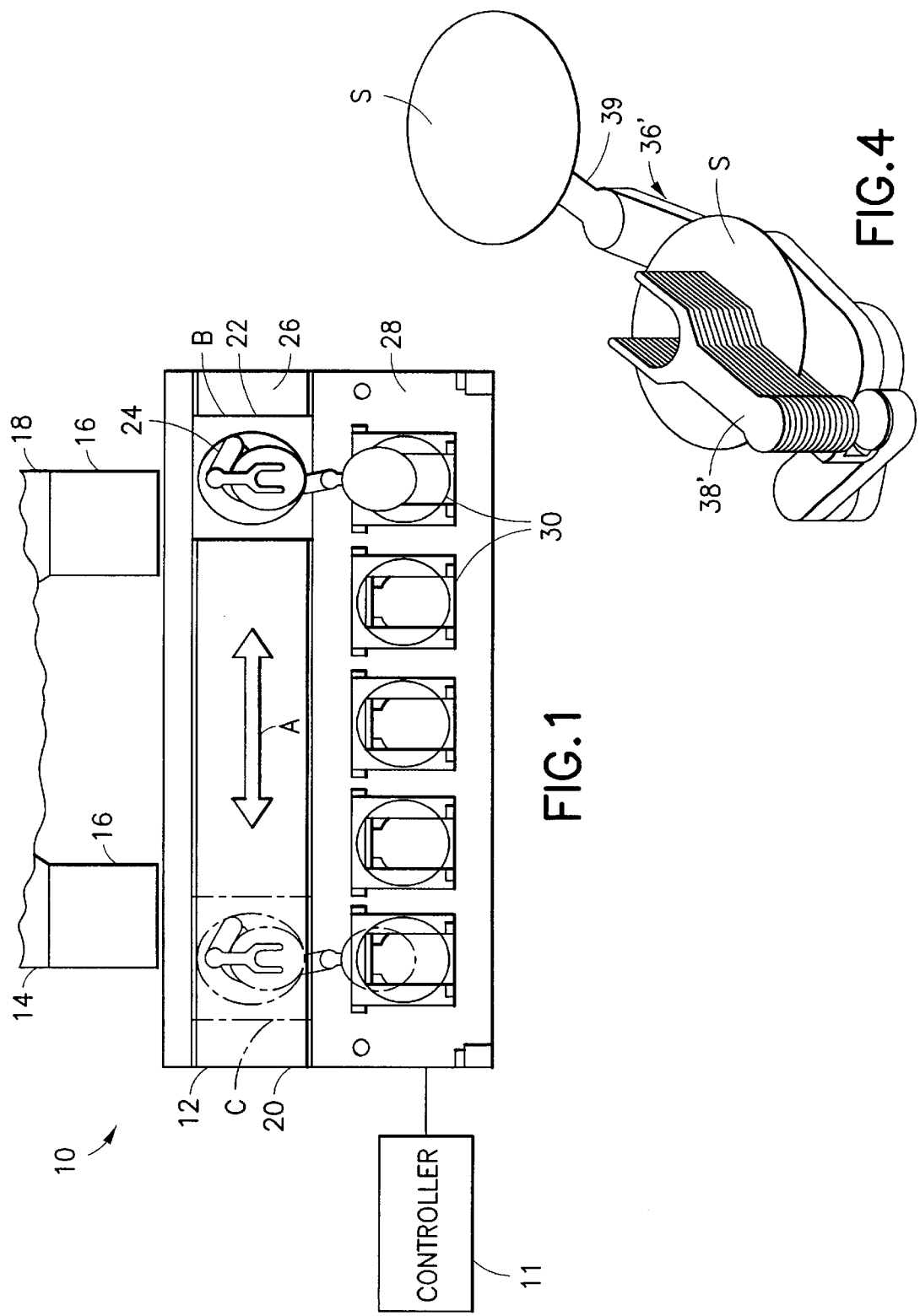
FIG. 1 is a partial schematic top view of a portion of a substrate processing apparatus incorporating features of the present invention.

Referring to FIG. 1, there is shown a partial top plan view of a substrate processing apparatus 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

The substrate processing apparatus 10 generally comprises a substrate transport apparatus 12 and a substrate processing apparatus 14. The substrate processing apparatus 14 has load locks 16 connected to the transport apparatus 12, processing chambers (not shown) connected to a main chamber 18, and a substrate transport robot (not shown). Numerous different types of substrate processing apparatus are known in the prior art, such as disclosed in U.S. Pat. Nos. 5,765,983; 5,512,320 and 4,715,921 which are hereby incorporated by reference in their entireties. However, any suitable type of substrate processing apparatus could be provided.

In this embodiment the substrate transport apparatus 12 generally comprises a frame 20, a car 22, a robot 24, a car drive 26 for moving the car along the frame 20, and means 28 for removably holding substrate cassettes 30. The apparatus 12 is used to remove substrates from the cassettes 30 and insert them into the substrate processing device 14 at the load locks 16. Once the substrate processing device 14 is finished processing a substrate, the apparatus 12 is used to return the substrate from the load locks 16 back to one of the cassettes 30. An operator can remove a cassette 30 after it have been filled with processed substrates and insert a new cassette of unproceessed substrates in its place. The apparatus 12 can be adapted to hold any suitable member of cassettes 30. Preferably, the apparatus operates in atmospheric pressure, but could be used in other pressure situations, such as in a vacuum. The transport apparatus 12 can have an aligner (not shown) to align the substrates. In an alternate embodiment, the apparatus 12 need not have an aligner, such as when the aligner is located in the substrate processing device 14. The apparatus 12 might also have a substrate buffer. The apparatus 12 is connected to a computer controller 11 which controls movement of the car 22 relative to the frame 20 and controls movement of the robot 24.

Figure 2:
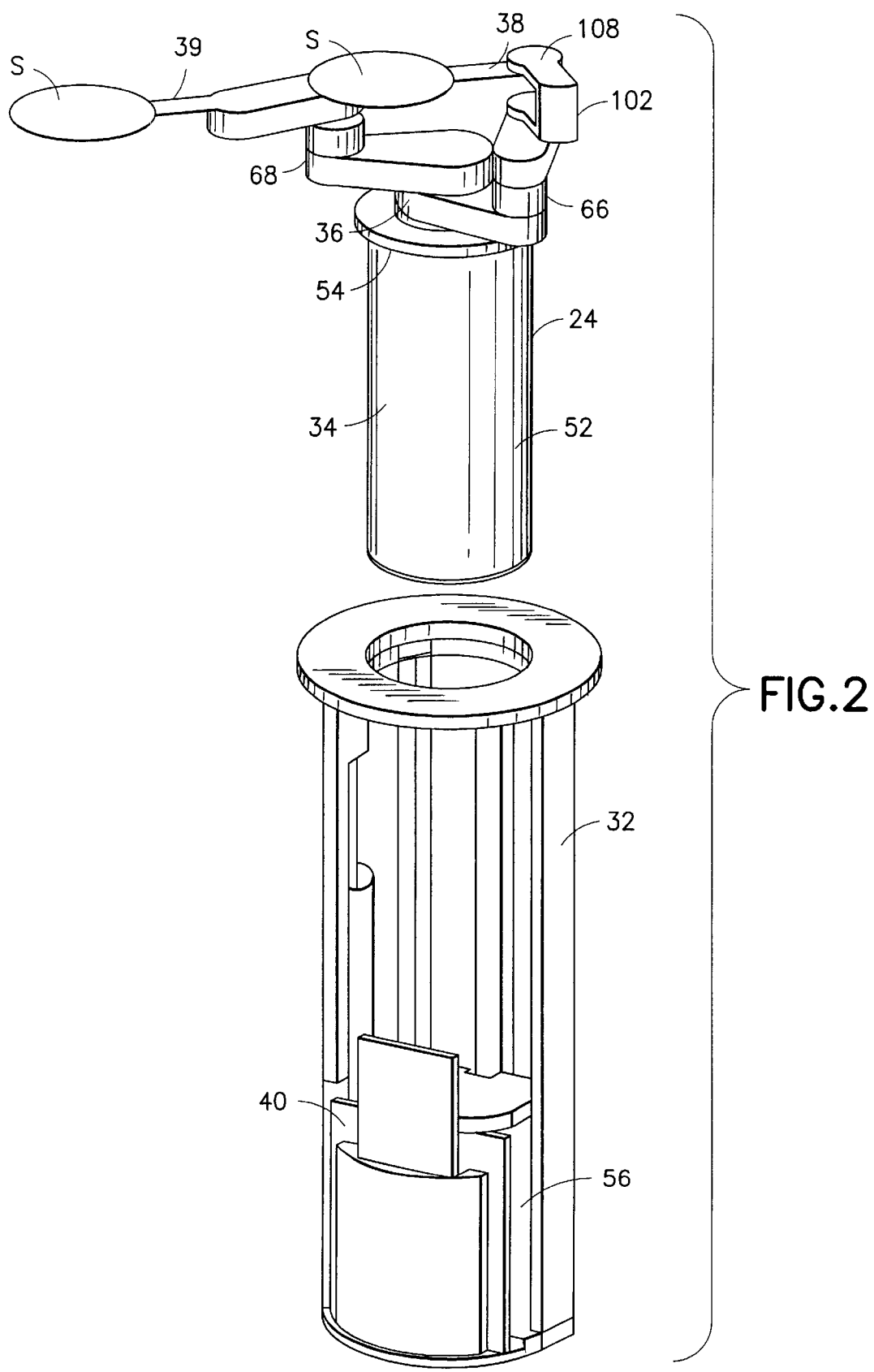
FIG. 2 is an exploded perspective view of a portion of the substrate transport apparatus shown in FIG. 1.

Referring also to FIG. 2 the robot 24 generally comprises a frame 32, a rotational drive 34, a movable arm assembly 36, and two end effectors 38, 39. The end effectors 38, 39 are adapted to hold substrates S thereon. The end effectors 38, 39 are attached to ends of the arm assembly 36. The drive 34 is adapted to move the arm assembly 36 to thereby move the end effectors 38, 39 into and out of the cassettes 30 and the load locks 16. The drive 34 is mounted to the car 22 by the frame 32. The frame 32 supports the robot 24 on the car 22 as a drop-in assembly and, provides a mounting frame for electronics control circuit boards 40. The car 22 is movably mounted to the frame 20. The car 22 can move along the frame 20 as indicated by arrow A between position B and position C. A similar substrate transport apparatus is described in U.S. Pat. No. 6,139,245 which is hereby incorporated by reference in its entirety. In alternate embodiments, features of the present invention could be used in any suitable type of substrate transporting robot including the robot inside the substrate processing apparatus 14 and other types of substrate transport apparatus. In alternate embodiments, any suitable type of track system or system for movably supporting the car along the frame could be used. The robot 24 could also be connected to the car in any suitable fashion. In another alternate embodiment, the robot relocating mechanism of the movable car 22 need not be provided, such as when the drive 34 remains at one location only on the frame 20. In a preferred embodiment a vertical drive motor 56 is connected to the bottom of the frame 32 to vertically move the robot 24 up and down in the frame 32. However, in an alternate embodiment any suitable type of vertical movement system could be provided or no vertical movement system need be provided. The frame 32 and robot 24 could use a vertical movement cage and track system such as disclosed in U.S. Pat. No. 5,894,760 which is hereby incorporated by reference in its entirety.

Figure 3:
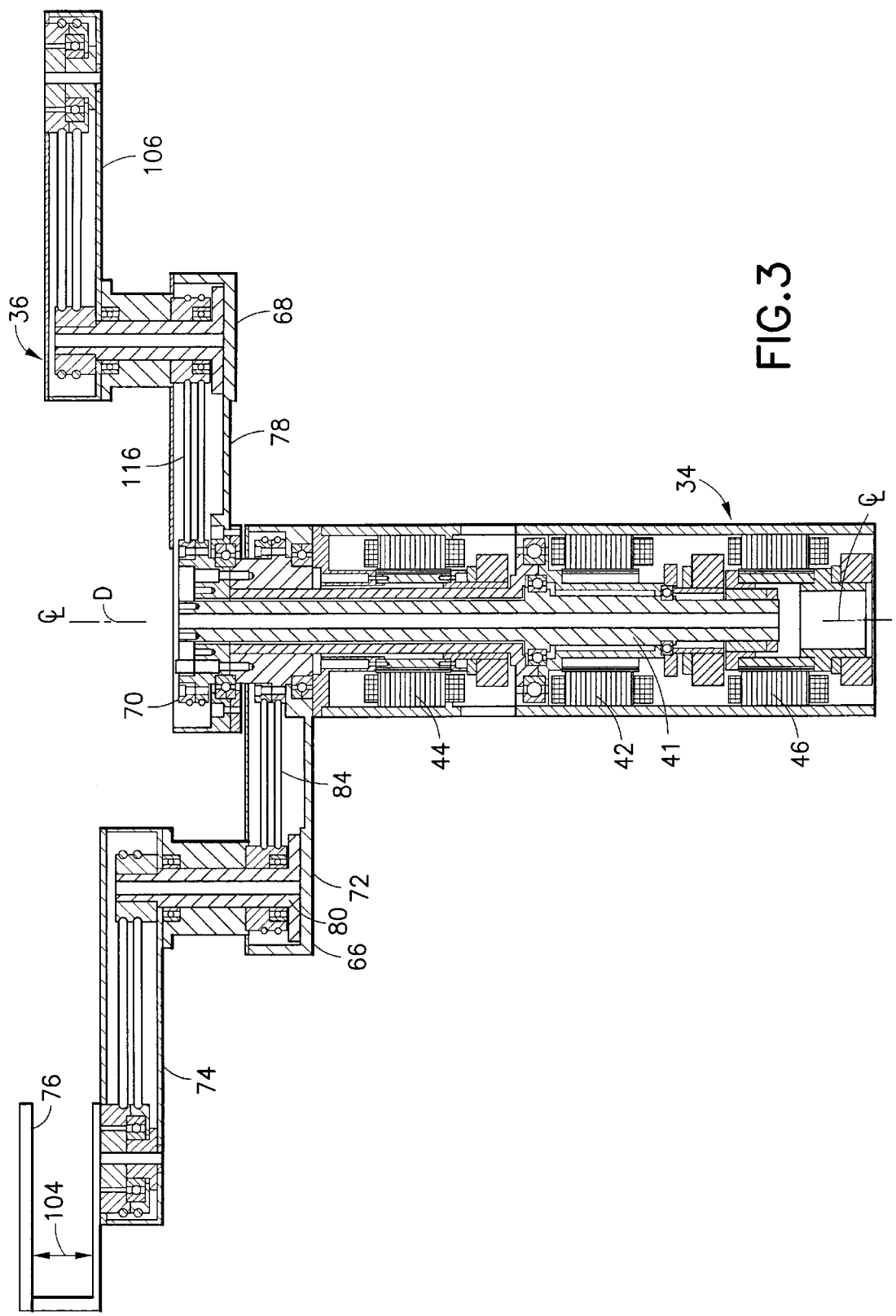
FIG. 3 is a cross-sectional view of a portion of the substrate transport apparatus.
Figure 3A:
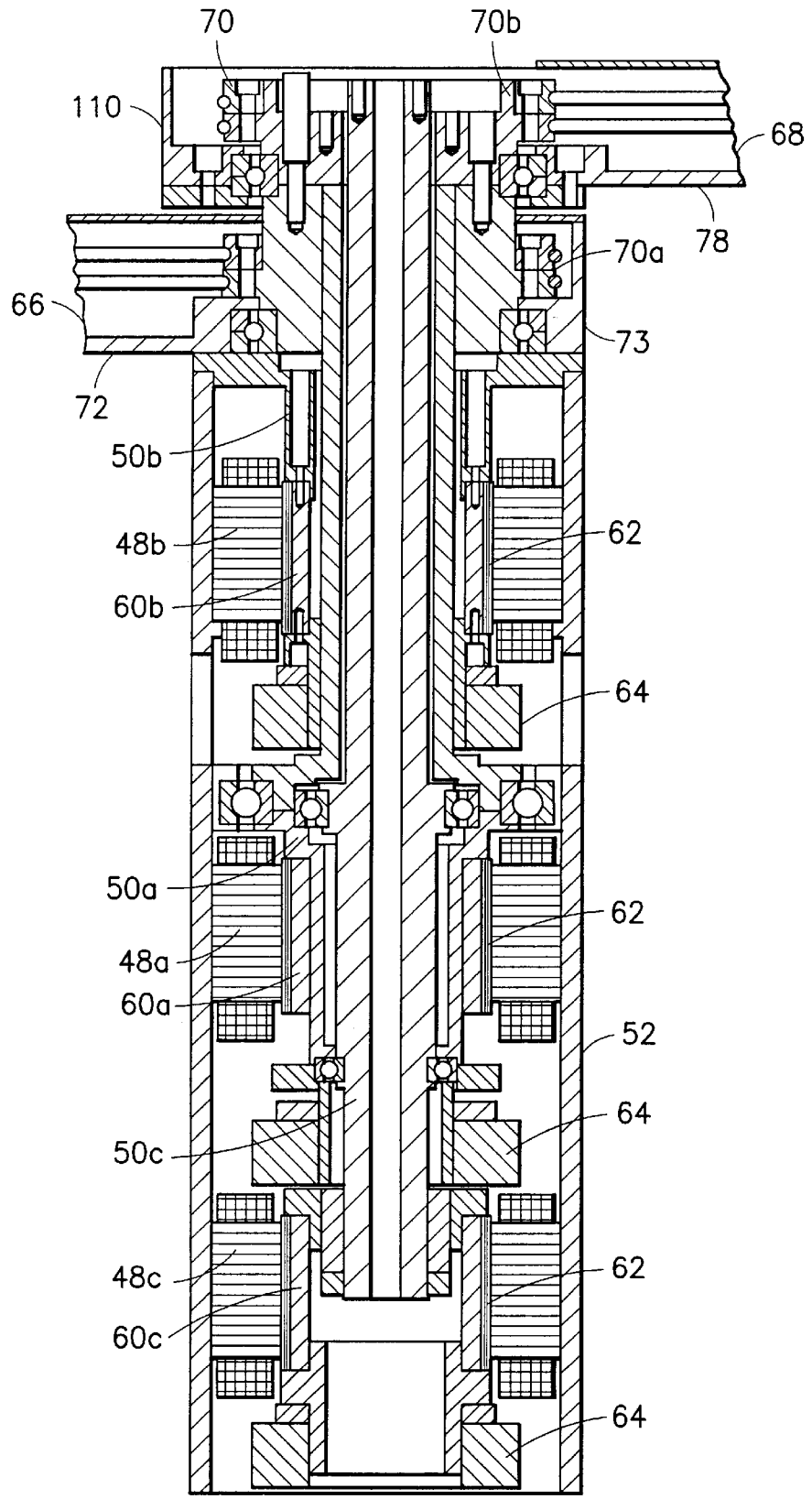
FIG. 3A is an enlarged cross-sectional view of the drive unit shown in FIG. 3.

Referring also to FIGS. 3 and 3A, the rotational drive 34 generally comprises a drive shaft assembly 41 and three motors 42, 44, 46. In an alternate embodiment the drive could have more than three motors. The drive shaft assembly 41 has three drive shafts 50a, 50b, 50c. In an alternate embodiment more than three drive shafts could be provided. The first motor 42 comprises a stator 48a and a rotor 60a connected to the middle shaft 50a. The second motor 44 comprises a stator 48b and a rotor 60b connected to the outer shaft 50b. The third motor 46 comprises a stator 48c and rotor 60c connected to the inner shaft 50c. The three stators 48a, 48b, 48c are stationarily attached to the tube 52 at different vertical heights or locations along the tube. In this embodiment the first stator 48a is the middle stator, the second stator 48b is the top stator and the third stator 48c is the bottom stator. Each stator generally comprises an electromagnetic coil. The three shafts 50a, 50b, and 50c are arranged as coaxial shafts. The three rotors 60a, 60b, 60c are preferably comprised of permanent magnets, but may alternatively comprise a magnetic induction rotor which does not have permanent magnets. Sleeves 62 are preferably located between the rotor 60 and the stators 48 to allow the robot 24 to be useable in a vacuum environment with the drive shaft assembly 41 being located in a vacuum environment and the stators 48 being located outside of the vacuum environment. However, the sleeves 62 need not be provided if the robot 24 is only intended for use in an atmospheric environment.

The third shaft 50c is the inner shaft and extends from the bottom stator 48c. The inner shaft has the third rotor 60c aligned with the bottom stator 48c. The middle shaft 50a extends upward from the middle stator 48a. The middle shaft has the first rotor 60a aligned with the first stator 48a. The outer shaft 50b extends upward from the top stator 48b. The outer shaft has the second rotor 60b aligned with the upper stator 48b. Various bearings are provided about the shafts 50 and the tube 52 to allow each shaft to be independently rotatable relative to each other and the tube 52. In this embodiment each shaft 50 is provided with a position sensor 64. The position sensors 64 are used to signal the controller 11 of the rotational position of the shafts 50 relative to each other and/or relative to the tube 52. Any suitable sensor could be used, such as optical or induction.

As seen in FIG. 3, the movable arm assembly 36 generally comprises two arms 66, 68 and a pulley 70. However, in alternate embodiments the movable arm assembly could have more than two arms or additional components. The first arm 66 generally comprises an inner arm 72, a forearm 74, a bridge 76 and the substrate holder 38 (see FIG. 2). Referring also to FIG. 3A, the inner arm 72 is fixedly attached to the outer shaft 50b such that the inner arm 72 rotates with the outer shaft 50b on the center axis of rotation D shown in FIG. 3. The pulley 70 is fixedly attached to the top end of the middle shaft 50a. The second arm 68 has an inner arm 78 which is fixedly attached to the top end of the inner shaft 50c. The pulley 70 and the inner arm 78 also are mounted for rotation about the center axis D.

Referring also to FIG. 3B, the inner arm 72 of the first arm 66 includes a post 80 and a pulley 82 rotatably mounted on the post 80. The post 80 is stationarily mounted on the frame 73 of the inner arm 72. A first set 84 of transmission members 86 extend between the pulley 70 and the pulley 82. Any suitable type of transmission members could be provided, such as a belt, band or chain. More or less than two of the transmission members 86 could be provided for the first set 84 and/or the other sets of transmission members described below. A shaft 88 is fixedly attached to the pulley 82 to rotate with the pulley 82 on axis E. The shaft 88 is rotatably supported on the post 80. The height of the shaft 88 is slightly larger than the height of the inner arm 78 of the second arm 68 to allow the inner arm 78 to pass between the inner arm 72 and forearm 74. The forearm 74 has a frame 90 which is fixedly attached to the top of the shaft 88 such that the frame 90 of the forearm 74 rotates with the shaft 88 and pulley 82 about axis E. The forearm 74 includes a pulley 92, a post 94, a pulley 96, and a second set 98 of transmission members 86. The pulley 92 is fixedly attached to the top end of the post 80. The post 94 is stationarily attached to the frame 90. The pulley 96 is rotatably supported on the post 94. The second set 98 of transmission members extends between the two pulleys 92, 96 and part 100 of the bridge 76. The bridge 76 is fixedly attached to the pulley 96 to rotate with the pulley 96 about axis F. The bridge 76 has pulley section 100 and a C-shaped section 102. The span 104 of the C-shaped section is sufficiently large to allow the forearm 106 of the second arm 68 (see FIG. 3) to pass therethrough. The end effector 38 (see FIG. 2) is attached to the top end 108 of the C-shaped section 102.

Referring now to FIGS. 3, 3A and 3C, the second arm 68 generally comprises the inner arm 78, the outer arm 106 and the end effector 39 (see FIG. 2). The inner arm 78 generally comprises a frame 110, a post 112, a pulley 114, and a third set 116 of transmission members 86. The frame 110 is fixedly attached to the inner shaft 50C for rotation about axis D. The pulley 70 extends into an open area of the frame 110.

The post 112 is stationarily attached to the frame 110. The pulley 114 is rotatable mounted on the post 112. The third set 116 of transmission members extend between the two pulleys 70, 114. A shaft 118 is fixedly attached to the pulley 114 and rotatably supported on the post 112 on axis G. The height of the shaft 118 is sufficient to allow the forearm 74 of the first arm 66 to pass between the inner arm 78 and forearm 106 of the second arm 68. The forearm 106 generally comprises a frame 120, a pulley 122, a fourth set 124 of transmission members 86, a post 126, and a pulley 128. The frame 120 is fixedly connected to the shaft 118 for rotation with the shaft 118 about axis G. The pulley 122 is stationarily attached to the top end of the post 112. The post 126 is stationarily attached to the frame 120. The pulley 128 is rotatably supported on the post 126. The fourth set 124 of transmission members extends between the two pulleys 122, 128. The second end effector 39 (see FIG. 2) is fixedly attached to the pulley 128 to rotate with the pulley 128 on axis H.

The main pulley 70, as seen best in FIG. 3A, generally comprises a bottom pulley section 70a and a top pulley section 70b. The two pulley sections 70a, 70b are fixedly attached to each other for rotation about axis D in unison with each other. The bottom pulley section 70a is located inside the frame 73 of the first arm's inner arm 66. The first set 84 of transmission members are mounted on the bottom pulley section 70a. The top pulley section 70b is located inside the frame 110 of the second arm's inner arm 78. The third set 116 of transmission members are mounted on the top pulley section 70b.

The three motors 42, 44, 46 are independently movable to independently move the two arms 66, 68 separately or at the same time. The arms 66, 68 can be moved to extend and retract the two end effectors 38, 39 for picking up and for placing substrates, and the drive 34 can rotate the entire movable arm assembly 36 about the main axis D to reorientate the movable arm assembly 36 relative to the car 22 and the source and target locations of the load locks 16 and cassettes 30.

In order to extend and retract the first arm 66, the second motor 44 is activated to rotate the outer shaft 50b relative to the middle shaft 50a. Preferably, the middle shaft 50a is kept stationary while the first arm 66 is being extended and retracted. However, the pulley 70 may be moved slightly during extension or retraction to speed up the transfer process with the start or finish of rotation of the entire movable arm assembly 36. With the pulley 70 kept stationary and the inner arm 72 moved, the pulley 82 is rotated by the first set 84 of transmission members. This, in turn, rotates the frame 90 of forearm 74 about the axis E. Because the pulley 92 is stationarily attached to the post 80, and because the post is stationarily attached to the frame 73, the pulley 96 and pulley section 100 are rotated by the second set 98 of transmission members relative to the frame 90. Preferably the pulleys 82, 92, 96 are sized relative to each other to allow the end effector 38 to be moved straight radially in and out.

In order to extend and retract the second arm 68, the third motor 46 is actuated to rotate the inner shaft 50C relative to the middle shaft 50a. Preferably, the middle shaft 50a is kept stationary while the first arm 66 is being extended and retracted. However, the pulley 70 may be moved slightly during extension or retraction to speed up the transfer process with the start or finish of rotation of the entire movable arm assembly 36. With the pulley 70 kept stationary and the inner arm 78 moved, the pulley 114 is rotated by the third set 116 of transmission members. This, in turn, rotates the frame 120 of forearm 106 about the axis G. Because the pulley 122 is stationarily attached to the post 112, and because the post 112 is stationarily attached to the frame 110, the pulley 128 is rotated by the fourth set 124 of transmission members relative to the frame 120. Preferably the pulleys 114, 122, 128 are sized relative to each other to allow the end effector 39 to be moved straight radially in and out.

The first motor 42 is used in conjunction with the two other motors 44, 46 in order to rotate the entire arm assembly 36 about the main axis D. The first motor 42 is rotated to rotate the middle shaft 50a and, thus, rotate the main pulley 70. The motors 44, 46 are moved in the same direction and speed as the motor 42 to rotate the inner arms 72, 78 with the pulley 70. Thus, the first set 84 and the second set 116 of transmission members do not rotate their respective pulleys 82, 114. Therefore, the forearms 74, 106 are not rotated relative to their respective inner arms 72, 78 and the pulleys 96, 128 are not rotated to rotate the end effectors 38, 39.

The present invention provides a dual scara arm robot on a concentric axis of rotation with independent extension and retraction with use of only three motors for a 3-axis drive and a common main rotatable pulley rather than two non-concentric scara arms having four motors for a 4-axis drive and two separate stationary main pulleys. The concentric rotated dual scara arms of the present invention allows the robot to have a smaller footprint than non-concentric dual scara arms. A smaller footprint can increase throughput because a smaller extension and retraction distance can be provided. A smaller footprint also reduces the cost per manufacturing floor space.

FIGS. 1 and 2 show the moveable arm assembly 36 with end effectors 38, 39 adapted to hold only singular substrates S. However, other types of end effectors could be used. For example, as shown in FIG. 4, the movable arm assembly 36' could have a single substrate end effector 39 and a multiple substrate end effector 38' for holding multiple substrates. The present invention could use a transfer method such as disclosed in U.S. patent application Ser. No. 09/044,820 which is hereby incorporated by reference in its entirety. The movable arm assembly could also have a substrate aligner thereon, use gravity holding only, vacuum holding or a combined gravity/vacuum holding, such as disclosed in U.S. patent application Ser. No. 08/889,526 which is also hereby incorporated by reference in its entirety.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate transport apparatus comprising:
   a drive section;
   two independently movable arm assemblies connected to the drive section on a common axis of rotation; and
   substrate holders connected to the arm assemblies on respective first and second substrate holder axes,
   wherein said substrate holder axes are capable of being simultaneously coaxial with said common axis during extension and retraction.

2. An apparatus as in claim 1, wherein the arm assemblies are each comprised of a scara arm with a shoulder at the common axis of rotation and a wrist at a distal end connected to the substrate holders.

3. An apparatus as in claim 1, wherein the drive section comprises a frame and a pulley rotatably connected to the frame on the common axis of rotation.

4. An apparatus as in claim 3, further comprising two transmission members connected between the pulley and separate respective ones of the arm assemblies.

5. An apparatus as in claim 4, wherein the drive section comprises three motors, a first one of the motors connected to the pulley, a second one of the motors connected to a first one of the arm assemblies, and a third one of the motors connected to a second one of the arm assemblies.

6. An apparatus as in claim 5, wherein each of the motors comprises a magnetic stator stationarily connected to the frame and a magnetically driven rotor.

7. An apparatus as in claim 6, wherein the rotors and stators have a sleeve therebetween.

8. An apparatus as in claim 6, wherein the drive section comprises three coaxial shafts having the rotors thereon.

9. An apparatus as in claim 3, further comprising a mounting housing for connecting the frame to a housing of a substrate processing apparatus and a vertical drive unit for vertically moving the frame relative to the mounting housing.

10. A substrate transport apparatus comprising:
two independently movable arm assemblies;
substrate holders connected to the arm assemblies on respective first and second substrate holder axes; and
a drive section having a frame, a pulley rotatably connected to the frame by a first drive, and second and third drive sections connected to the arm assemblies, wherein the pulley is operably connected to both the two arm assemblies by transmission members, said drive sections being respectively connected to said arm assemblies on a common axis,
wherein said substrate holder axes are capable of being simultaneously coaxial with said common axis during extension and retraction.

11. An apparatus as in claim 10, wherein the arm assemblies are rotatably connected to the frame on a common axis of rotation.

12. An apparatus as in claim 11, wherein the drive sections comprise at least three coaxial drive shafts with magnetically driven sections, and magnetic driving stators stationarily connected to the frame.

13. An apparatus as in claim 10, wherein the pulley comprises a first section located inside a first one of movable arm assemblies and a second section located inside a second one of the movable arm assemblies.

14. An apparatus as in claim 13, wherein the transmission members comprise a first transmission belt on the first section of the pulley and a second transmission belt on the second section of the pulley, and wherein the first and second sections of the pulley are vertically offset from each other.

15. An apparatus as in claim 10, wherein the drive sections comprise three magnetic driving stators stationarily connected to the frame at different heights along the frame.

16. A substrate transport apparatus comprising:
N independently movable arm assemblies, each arm assembly having A axes of rotation about which at least a portion of the arm assembly can rotate, wherein N and A are integers greater than one;
substrate holders connected to the arm assemblies on respective first and second substrate holder axes, and
means for independently rotating each of the arm assemblies about their respective A axes, the rotating means comprising M motors, wherein M is an integer less than N times the smallest value of A,
wherein said substrate holder axes are capable of being simultaneously coaxial with said A axes during extension and retraction.

17. An apparatus as in claim 16, wherein N is 2, A is 2 for each arm assembly, and M is 3.

18. An apparatus as in claim 16, wherein the motors each comprise a magnetic driving stator and a magnetic driven rotor.

19. An apparatus as in claim 18, wherein the rotating means comprises M coaxial shafts having the rotors thereon.

20. An apparatus as in claim 19, wherein a pulley is connected to one of the shafts and N transmission belts extend from the pulley to portions of the respective N movable arm assemblies.

21. An apparatus as in claim 16, wherein A is the same for at least two of the arm assemblies.

22. An apparatus as in claim 16, wherein one axis of rotation from at least two of the arm assemblies are a common axis.

23. A substrate transport apparatus comprising:
a drive section;
two independently movable arm assemblies connected to the drive section on a common axis of rotation;
substrate holders connected to the arm assemblies on respective first and second substrate holder axes,
wherein said substrate holder axes are capable of being coaxial with said common axis during extension and retraction,
further comprising two transmission members connected between the pulley and separate respective ones of the arm assemblies,
wherein the drive section comprises three motors, a first one of the motors connected to the pulley, a second one of the motors connected to a first one of the arm assemblies, and a third one of the motors connected to a second one of the arm assemblies,
wherein each of the motors comprises a magnetic stator stationarily connected to the frame and a magnetically driven rotor, and
wherein the rotors and stators have a sleeve therebetween.

24. A substrate transport apparatus comprising:
a drive section;
two independently movable arm assemblies connected to the section on a common axis of rotation;
substrate holders connected to the arm assemblies on respective first and second substrate holder axes,
wherein said substrate holder axes are capable of being coaxial with said common axis during extension and retraction,
wherein the drive section comprises a frame and a pulley rotatably connected to the frame on the common axis of rotation,
further comprising two transmission members connected between the pulley and separate respective ones of the arm assemblies,
wherein the drive section comprises three motors, a first one of the motors connected to the pulley, a second one of the motors connected to a first one of the arm assemblies, and a third one of the motors connected to a second one of the arm assemblies,
wherein each of the motors comprises a magnetic stator stationarily connected to the frame and a magnetically driven rotor, and
wherein the drive section comprises three coaxial shafts having the rotors thereon.

* * * * *